United States Patent [19]
Pankove et al.

[11] Patent Number: 5,703,896
[45] Date of Patent: Dec. 30, 1997

[54] SILICON QUANTUM DOT LASER

[75] Inventors: Jacques Isaac Pankove; Garret Robin Moddel; Kenneth Douglas, all of Boulder, Colo.

[73] Assignee: The Regents of the University of Colorado, Boulder, Colo.

[21] Appl. No.: 612,021

[22] Filed: Mar. 5, 1996

Related U.S. Application Data

[63] Continuation-in-part of Ser. No. 473,523, Jun. 7, 1995, Pat. No. 5,559,822.
[51] Int. Cl.$^6$ .................................................. H01S 3/19
[52] U.S. Cl. .......................... 372/50; 372/23; 372/46; 372/92
[58] Field of Search ........................ 372/50, 23, 45, 372/46

[56] References Cited

U.S. PATENT DOCUMENTS

| | | | |
|---|---|---|---|
| 4,815,087 | 3/1989 | Hayashi | 372/45 |
| 4,976,539 | 12/1990 | Carlson et al. | 356/5 |
| 5,019,787 | 5/1991 | Carlson et al. | 330/4.3 |
| 5,077,752 | 12/1991 | Tada et al. | 372/96 |
| 5,103,456 | 4/1992 | Scifres et al. | 372/50 |
| 5,131,001 | 7/1992 | Carlson | 372/50 |
| 5,214,664 | 5/1993 | Paoli | 372/45 |
| 5,563,900 | 10/1996 | Ackley et al. | 372/45 |

OTHER PUBLICATIONS

Article "Transfer of Biologically Derived Nanometer–Scale Patterns of Smooth Subtrates" By K. Douglas et al, SCIENCE, vol. 257, 7/31/92, pp. 642–644.

*Primary Examiner*—James W. Davie
*Attorney, Agent, or Firm*—Francis A. Sirr; Earl C. Hancock

[57] ABSTRACT

Dynamic variation in the color produced by a silicon quantum dot laser is achieved by utilizing segmented sections or patches of quantum dots of differing sizes to produce different colors of light. The amount of each color of light produced is controlled by selectively biasing the segments of quantum dots. The light is caused to resonate coherently and is emitted out by a diffraction grating. The dynamic variation in the color of light produced by such a device makes it useful as a multicolor pixel in a color display of images.

4 Claims, 4 Drawing Sheets

SILICON QUANTUM DOT LASER

This application is a continuation in part of patent application Ser. No. 08/473,523 filed on Jun. 7, 1995 for SILICON QUANTUM DOT LASER, now U.S. Pat. No. 5,559,822.

This invention was made with Government support awarded by the National Science Foundation and also by the U.S. Air Force Office of Scientific Research under contract number F49620-92-J-0482. The Government has certain rights in this invention.

BACKGROUND OF THE INVENTION

1. Field of the Invention

This invention relates to the use of silicon quantum dots in a surface emitting laser. More specifically, this invention relates to dynamic variation in the color produced by such a device.

2. Description of the Related Art

Quantum well lasers are known in the art. The use of quantum dots, or small volumes of semiconductor, leads to quantized energy states, resulting in narrow spectrum light. Some examples of patents in this field are U.S. Pat. No. 5,131,001 by Carlson, U.S. Pat. No. 5,103,456 by Scifres et al., U.S. Pat. No. 5,077,752 by Toda et al., U.S. Pat. No. 5,019,787 by Carlson et al., U.S. Pat. No. 4,976,539 by Carlson et al., and U.S. Pat. No. 4,815,087 by Hayashi. In general, a quantum well region is formed in an active layer between two opposite conductivity type semiconductor layers of a wider energy bandgap than the quantum well region. The light is made coherent by some means, such as a distributed feedback mechanism, which creates changes in the optical index periodically, with the period relating to the wavelength of the light. A grating is used to pick off the laser light which is propagating laterally within the active lasing layer.

Recent advances in the technique of producing the quantum dots within the active lasing layer have improved the quality and uniformity of the coherent light capable of being produced. "Transfer of Biologically Derived Nanometer-Scale Patterns to Smooth Substrates" by K. Douglas et al., *Science*, Vol. 257, 31 Jul., 1992, describes a procedure for producing quantum dots of extremely uniform size and spacing. The size of the dots is controllable by varying the particular protein used in the process described. Thus, it is possible, by selecting the size of the quantum wells, to change the frequency of the light generated by a quantum well device. However, no one until now has developed a mechanism for dynamically changing the color of light emitted from such a device, nor have they made uniformly sized quantum dots in silicon.

SUMMARY OF THE INVENTION

An object of the present invention is to provide apparatus and methods to dynamically vary or control the color of light emitted by a silicon quantum dot laser. Such capability provides greater utility for the laser; for example, as a pixel in a color display for moving images.

In order to accomplish this object, a plurality of first-sized quantum dots is provided to produce a first color of light, a plurality of second-sized quantum dots produce a second color of light, and a plurality of third-sized quantum dots produce a third color of light. Means for causing the first-sized dots, the second-sized dots, and the third-sized dots to produce varying amounts of light allows a variety of colors to be perceived by the human eye. The device emits light perpendicular to its surface. The light is resonated in order to make it coherent.

Apparatus in accordance with this invention produces dynamically varying colors of light employing a plurality of first-sized quantum dots for producing a first color of light which are selectively caused by a first controller to produce a varying amount of light. A plurality of second-sized quantum dots are arranged for producing a second color of light in varying amounts as selected by a second controller. Yet another plurality of third-sized quantum dots produces a third color of light in varying amounts as selected by a third controller. At least a portion of the first and second colors of light or of the first, second, and third colors of light is then extracted from the apparatus.

This apparatus can include an arrangement for resonating the produced light for stimulating coherent light emission. The extracted light is that which is normal to a surface of the apparatus.

The light extraction is performed in one embodiment by sectors of concentric circular grating, the spacing of said grating sectors being a function of the light extracted. Preferably, the grating sector spacing is proportional to the wavelength of the light extracted.

The controllers can stimulate the associated quantum dots via contacts for selectively voltage biasing those quantum dots. The quantum dots can take the form of a crystalline silicon with a lasing layer formed of the crystalline silicon dots in a hydrogenated silicon isolation matrix.

More particularly, the present invention produces dynamically varying colors of light via a lasing layer formed of crystalline silicon quantum dots formed in an isolation matrix of hydrogenated silicon. These dots are formed in three patches having different sized dots to produce three different colors of light. The device further includes a barrier layer of p-type silicon carbide under the lasing layer, a substrate wafer under that barrier layer, an n-type silicon carbide layer above the lasing layer, and a positive contact beneath the substrate. Three negative contacts, one above each patch of different sized dots, acts with the positive contact to selectively bias the three patches.

Three sectors of concentric grating surround the lasing layer patches. These sectors have radial periods corresponding to the colors of light produced by the three patches for resonating photons emitted by the patches to stimulate coherent light emission. A dielectric mirror can be placed between the barrier layer and the substrate.

More particularly, the present invention produces dynamically varying colors of light from a plurality of groups of quantum dots with the dots of each group configured for producing a composite of light of a color different from the light produced by the dots of any other group. The dots of selected ones of the groups emit colored light therefrom. A plurality of optical resonance producing structures each provide optical resonance for a respective one of the dot groups.

The dot actuator includes an arrangement for introducing an input signal to each selected dot group with the input signal magnitude correlated to a predetermined amount of light from the selected group.

As is described in greater detail hereinbelow, the optical resonance producing structure preferably includes a plurality of optical grating segments. Each of those grating segments is positioned in proximity to a respective one of the quantum dot groups. Further, they are each sized for providing optical resonance for the proximal group for producing output light therefrom. The dot groups and the optical grating segments in proximity thereto are formed as segments of an arc around a central axis. Pairs of those arc segments on opposite sides of the central axis are configured for producing the same color light. It is believed a particularly useful array would thus include six of those arc segments arranged in opposite pairs of arc segments with the respective pairs producing red, green and blue light as outputs therefrom.

The dot group actuators can include a common electrode underlying all dot groups, and a plurality of electrodes of equal number to the number of arc segments with each such electrode overlying a respective dot group. Thus, by applying a biasing signal to selected ones of the group overlying electrodes, those groups are enabled for light generation therefrom.

Those having normal skill in the art will recognize the foregoing and other objects, features, advantages and applications of the present invention from the following more detailed description of the preferred embodiments as illustrated in the accompanying drawings.

BRIEF DESCRIPTION OF THE DRAWINGS

FIG. 6 is composed of FIGS. 6A and 6B.

DETAILED DESCRIPTION OF THE PREFERRED EMBODIMENTS

Figure 1:
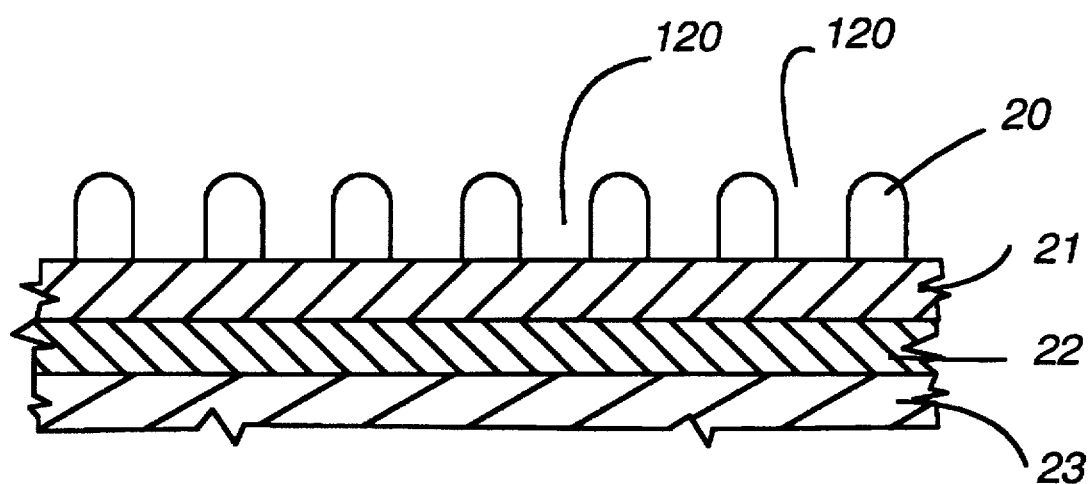
FIG. 1 is a sectioned side view of an initial stage of fabrication of a prior art array of quantum dots.

FIG. 1 shows a sectioned side view of an initial stage of fabrication of an array of quantum dots. For a complete description of a well-known fabrication process, please refer to K. Douglas et al., "Transfer of Biologically Derived Nanometer-Scale Patterns to Smooth Surfaces," *Science*, Vol. 257, 31 Jul. 1992, pp. 642–644.

Briefly, an organic array 20 is used as a mask to define the size and location of crystalline silicon quantum dots within hydrogenated amorphous silicon layer 21. For example, two dimensional protein crystals are adsorbed onto a smooth substrate 21 and overcoated with a 1.2 nm titanium (Ti) thin film that oxidizes to TiOx.

One approach to locally crystallizing hydrogenated amorphous silicon layer 21 (a-Si:H) is to bombard a-Si:H layer 21 with ions or electrons through mask 20, whereupon a crystalline cylinder is formed having equal diameter and height. This forms a zero dimensional quantum box (so called because it permits zero degrees of freedom of movement). Another approach is to coat the exposed surface of layer 21 with a thin layer of palladium (Pd). Wherever the Pd is in contact with a-Si:H layer 21 (i.e., in the openings of mask 20), a-Si:H crystallizes into c-Si in one-half hour at an annealing temperature of about 525° C. The rest of a-Si:H layer 21 needs a temperature of 725° C. to crystallize in the same period of time. Hence, only the regions defined by openings 120 in mask 20 become quantum boxes.

Layer 22 is made of amorphous hydrogenated SiC (a-SiC:H) and provides a larger bandgap semiconductor barrier adjacent to the c-Si quantum boxes. A quantum box is a lower bandgap material surrounded by higher bandgap semiconductors. The high bandgap barrier confines the electrons, or holes to within the small bandgap regions that thus become quantum boxes. Underlying p+Si crystal 23 is the convenient substrate (not shown) on which the array of quantum dot devices is formed.

Figure 2:
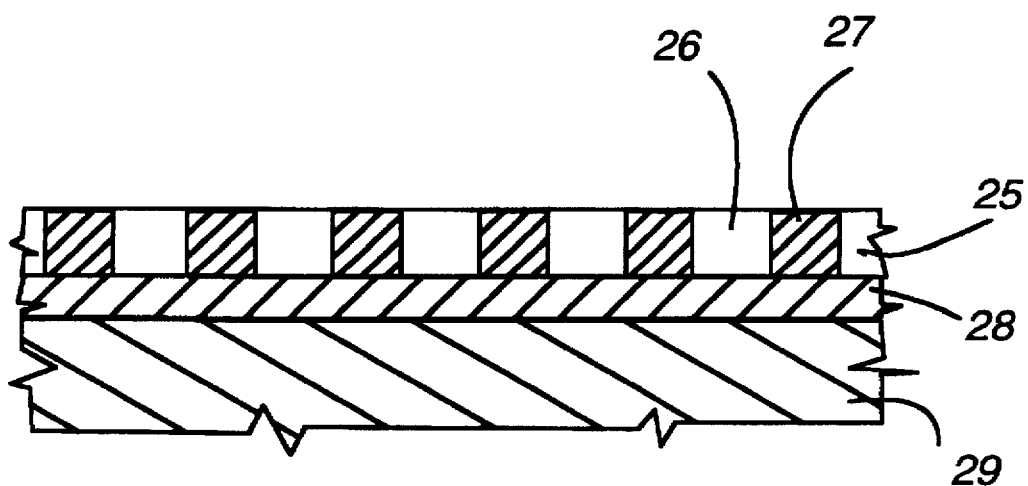
FIG. 2 is a side section view of the array fabrication of FIG. 1 at a later stage.

The result is uniformly spaced crystalline silicon dots 26 in a hydrogenated amorphous silicon (a-Si:H) isolation matrix 27 as shown in FIG. 2. Lasing layer 25 containing dots 26, and isolation matrix 27 is disposed on top of a layer 28 of p-type a-SiC:H (the barrier layer) which is on top of a wafer 29 of p+c-Si. Lasing layer 25 is 1 to 2 nm thick. Barrier layer 28 is 10 to 15 nm thick. Substrate 29 is typically about 0.5 mm thick, although the thickness of substrate 29 is not critical since it simply provides physical support.

Figure 3:
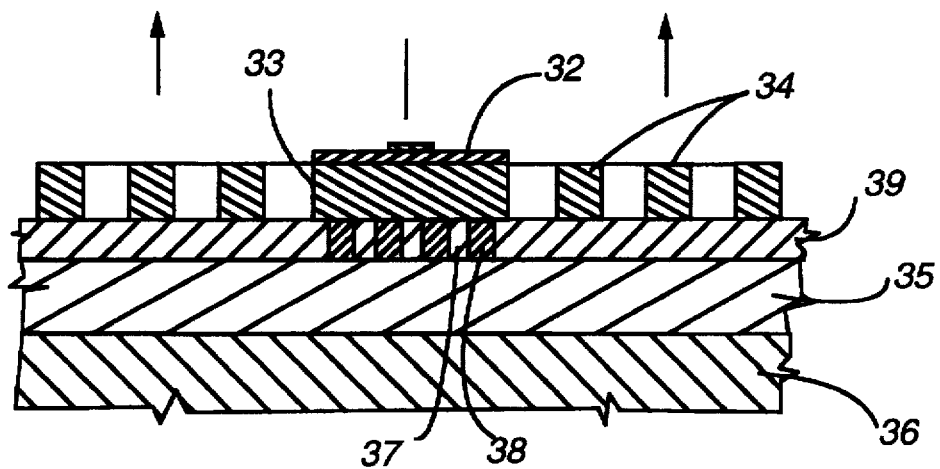
FIG. 3 is a sectioned side view of a one color quantum dot laser having a circular grating in accordance with the prior art.

FIG. 3 shows a sectioned side view of a one color quantum dot laser having a circular grating. A layer 35 of p-type silicon carbide underlies lasing layer 39, comprising crystalline silicon dots 37 in an isolation matrix 38 similar to that shown in FIG. 2. A layer 33 of n-type silicon carbide is disposed above a portion of lasing layer 39. On top of n-type layer 33 is a metal contact 32. A second conducting contact (not shown) is disposed beneath substrate 36. A circular grating 34 overlies the rest of lasing layer 39; i.e., overlies the portion of layer 39 that is not covered by n-type layer 33. Grating 34 and layer 33 are carved (etched) from the same layer of n-type a-SiC:H.

A dielectric mirror (not shown) may be disposed between layers 35 and 36 for reflecting the laser light upward. Such a dielectric mirror would be composed of a stack of alternating quarter-wavelength-thick layers of silicon and silicon carbide.

In operation, circular grating 34 serves two purposes. First it provides distributed feedback to make the laser light coherent. This occurs because the index of refraction varies slightly under grating 34. As the light travels along lasing layer 39, it is partly reflected by the periodic variations in the index of refraction. Most of the light continues on its original path, but the part that is reflected back stimulates further radiative recombination and induces coherence of the emitted light. The difference in the index of refraction is approximately several parts in 1000. An effective resonance chamber is formed, and the light becomes coherent. Typically, the grating spacing should be $\Delta L = \lambda/2n$ where $\lambda$ is the wavelength of the light in vacuum, and $n$ is the refractive index of grating 34.

The second function of grating 34 is to pick off a portion of the coherent light and form a collimated plane wave travelling perpendicular to lasing layer surface 39. This is second order diffraction.

Lasing occurs in lasing layer 39 when a forward bias voltage is applied across contact 32 and the second contact (not shown) that is located on the lower surface of layer 36. Contact 32 is attached to the negative side of a voltage source (not shown), and the second contact is attached to the positive side of this voltage source. This allows electrons to flow from n-type silicon carbide layer 33 into intrinsic silicon quantum dots 37, and allows holes to flow from p-type silicon carbide layer 35 to quantum dots 37. When the holes and electrons recombine in dots 37, photons are emitted.

Quantum dots 37 are located about 200 angstroms apart for isolation, and are in the shape of cylinders, about 15 angstroms high and about 15 angstroms in diameter. The exact size of dots 37 is dictated by the color of laser light to be generated. For red light, having a wavelength of around 6500 angstroms, each quantum dot 37 must be 20 angstroms in depth and 20 angstroms in diameter. For blue light, each dot 37 must be about 10 angstroms in diameter and depth, and for green light, each dot 37 must be about 15 angstroms in diameter and depth.

Figure 4:
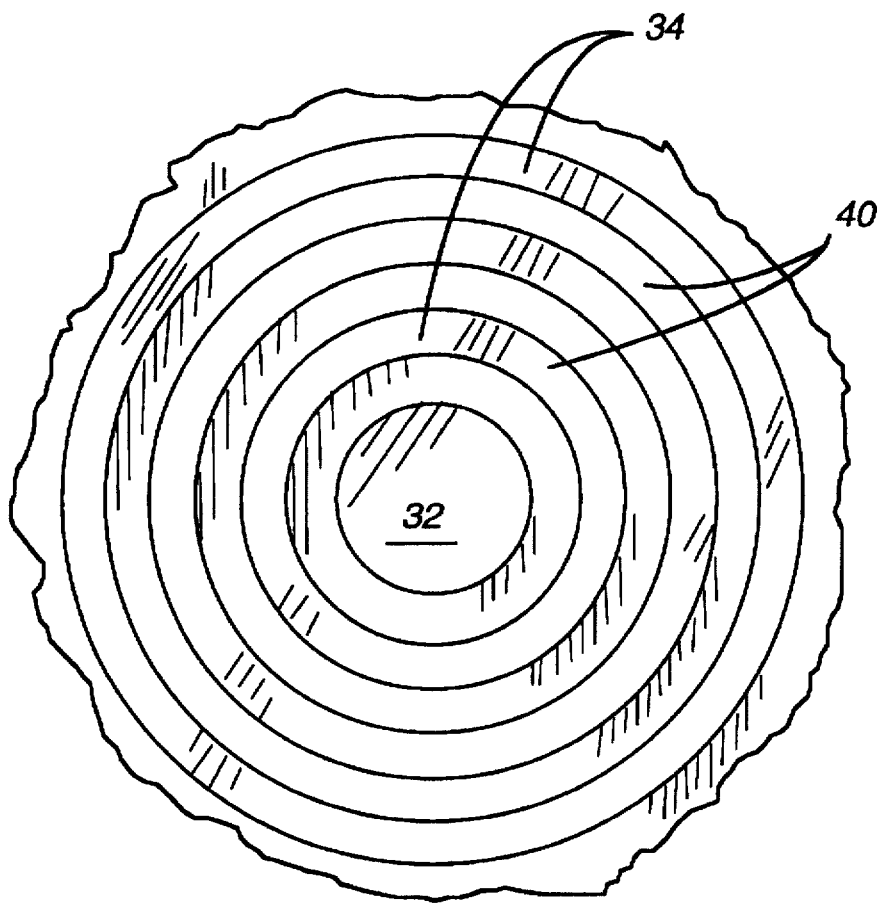
FIG. 4 is a top view of the grating of FIG. 3.

FIG. 4 shows a top view of grating 34 of FIG. 3. Grating 34 is formed of n-type SiC, as is layer 33 of FIG. 3, but layer 34 is cut out, or etched, to form a plurality of concentric rings (only a few of the interior rings are shown). The widths of cutouts 40 and the widths of rings 34 are about $\lambda/2n$. There must be at least 10 rings and preferably more than 20 rings, in order to form an effective resonator. As discussed above, the index of refraction under grating 34 is slightly different from the index of refraction under cutouts 40. The difference is negligible in terms of its effect on the relative radial sizes of grating 34 and cutouts 40, but it is sufficient to cause reflection at the boundaries between the rings of grating 34 and cutouts 40.

As discussed above, grating 34 performs a secondary function of picking off light from lasing layer 39 and projecting it perpendicular to the surface of lasing layer 39, as shown by the upward directed arrows in FIG. 3.

Figure 5:
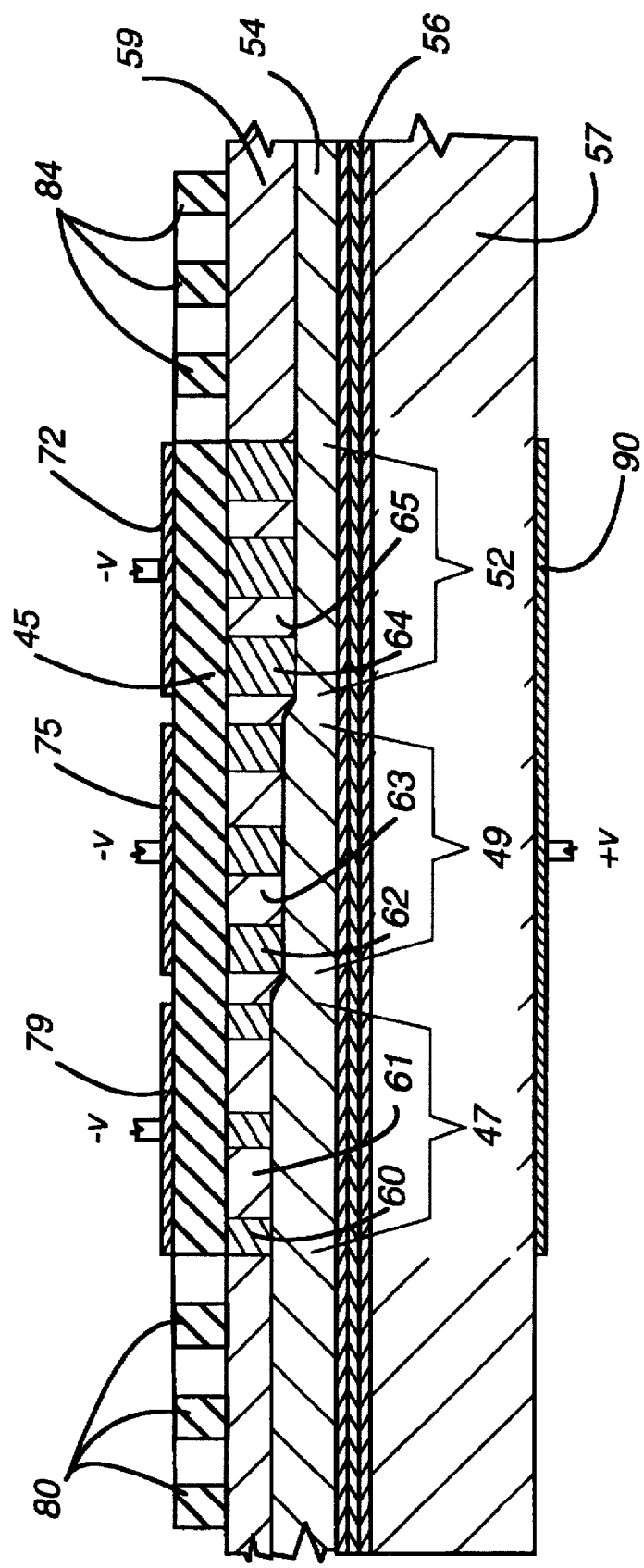
FIG. 5 is a sectioned side view of a three color quantum dot laser having a circular grating according to the present invention.
Figure 6A:
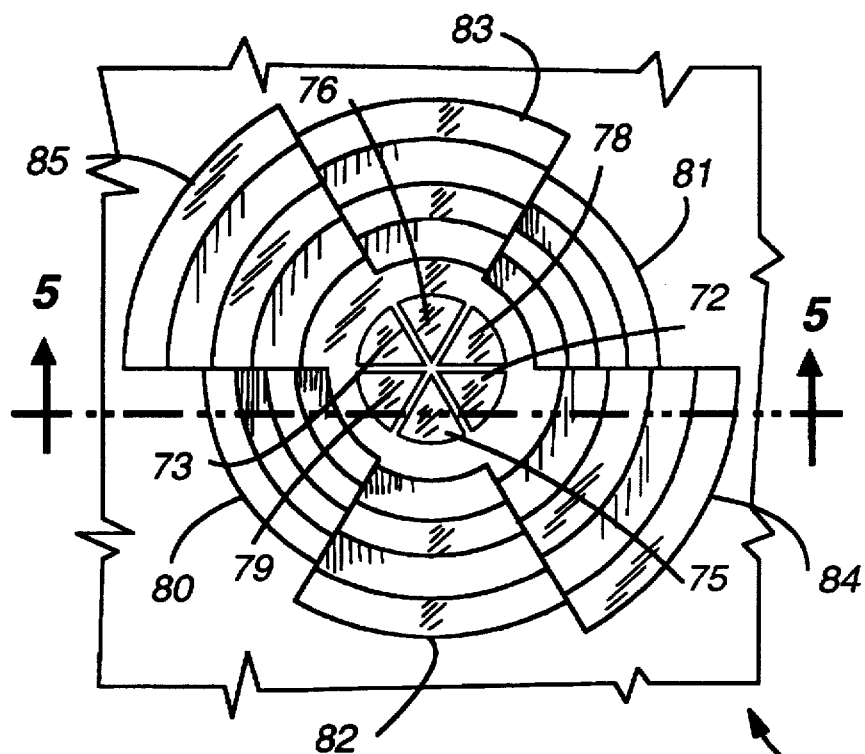
FIG. 6A is a top view of the circular grating and contacts of FIG. 5.
Figure 6B:
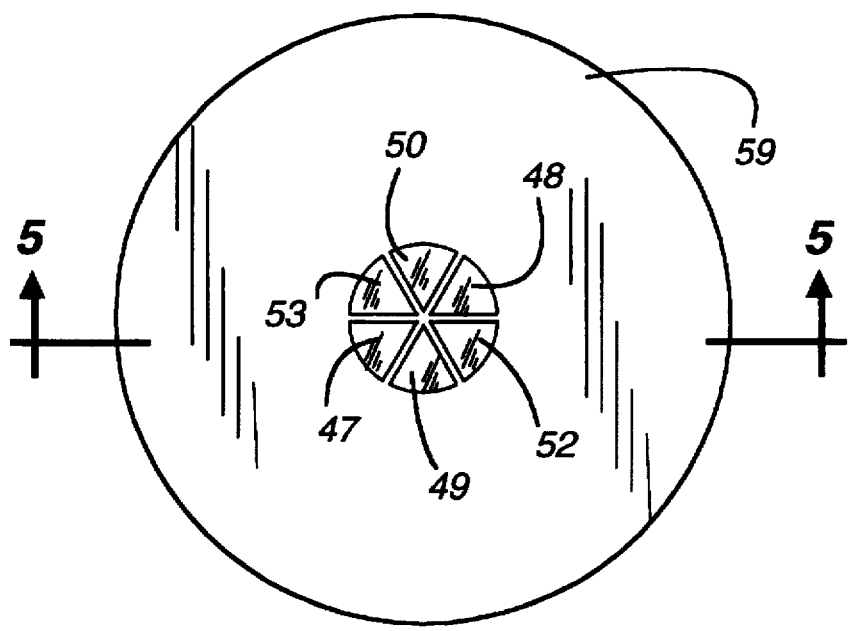
FIG. 6B is a top view of the lasing layer of FIG. 5.

FIG. 5 is a sectioned side view of a three color quantum dot laser embodiment of the present invention, taken along section line 5—5 of FIG. 6A. Its structure is somewhat similar to FIG. 3. FIG. 6A presents a top view of the six top contacts 72, 73, 75, 76, 78, 79, and the six circular grating portions 80, 81, 82, 83, 84, and 85 of FIG. 5. FIG. 6B shows a top view of lasing layer 59, and better illustrates the placement of the six lasing patches 47, 48, 49, 50, 51, 53 of FIG. 5. FIG. 5 is taken along section line 5—5 of both FIGS. 6A and 6B.

Three pairs of 180-degree disposed top contacts (78 and 79 for blue light, 75 and 76 for green light, and 72 and 73 for red light) overlie an n-type silicon carbide layer 45 shown in FIG. 5. As shown in FIGS. 5 and 6A, a segmented circular grating 46 (having six segmented arrays 80–85) surrounds the six top contacts 72, 73, 75, 76, 78, 79 and layer 45. A pair of blue lasing patches 47 and 48 (only patch 47 is visible in FIG. 5), each consisting of an isolation matrix 60 and quantum dots 61, underlie n-type layer 45 and top contacts 78 and 79. Thus, when contacts 78 and 79 are electrically biased, blue lasing patches 47 and 48 are stimulated to emit blue light.

Counterclockwise (in FIG. 6B) adjacent to blue lasing patches 47 and 48 are respective green lasing patches 49 and 50. Only front patch 49 is visible in FIG. 5. Patches 49 and 50 are formed of isolation matrix 62 and green quantum dots 63. Green quantum dots 63 are larger in diameter than blue quantum dots 61 in order to produce the longer wavelength green light. When top contacts 75 and 76 are biased, green lasing patches 49 and 50 are stimulated to emit green light.

Counterclockwise adjacent to green lasing patches 49 and 50 are red lasing patches 52 and 53, comprising red quantum dots 65 and isolation matrix 64. Patches 52 and 53 underlie top contacts 72 and 73, and produce red light when top contacts 72 and 73 are electrically biased. Red quantum dots 65 are larger in diameter than green quantum dots 63 to produce the longer wavelength red light.

Creating the three pairs of lasing patches 47 and 48, 49 and 50, 52 and 53, each having a different size of quantum dots 61, 63, 65, requires an extra manufacturing step. A first, coarse, mask (not shown) is used to assign areas to the different sized quantum dots 61, 63, 65. This first mask causes different size protein arrays to adhere to different regions of layer 59 of a-Si:H. Then, different protein arrays can be used as masks for creating the correct size of quantum dots in regions 47 and 48, 49 and 50, and 52 and 53. Also, the thickness of layer 59 is adjusted to equal the diameter of the corresponding quantum boxes. Thickness is controlled by the duration of the deposition over the three regions.

Layer 54 is p-type silicon carbide. Under layer 54 is a dielectric mirror 56 composed of a stack of alternating quarter-wavelength thick layers of silicon and silicon carbide. Dielectric mirror 56 increases the efficiency of the device by reflecting light scattered downward by grating 46 of FIG. 6A. Layer 57 is a substrate supporting lasing patches 47 and 48, 49 and 50, 52 and 53 and circular grating 46.

Lasing occurs in the three pairs of lasing patches 47 and 48, 49 and 50, and 52 and 53 when voltage is applied across top contacts 72, 73, 75, 76, 78, 79, and lower contact 90 located beneath layer 57. Grating 46 is divided into three pairs of concentric sectors, 80 and 81 for blue light, 82 and 83 for green light, and 84 and 85 for red light, as shown in FIG. 6A. Grating 46 accomplishes two functions. First, each pair of grating sectors provides distributed feedback for its associated color of light by reflecting a small portion of the light backward to create resonance, thereby making the light coherent. Second, each pair of grating sectors picks off its associated color of light, forming by second order diffraction of a plane wave travelling perpendicular to the lasing surface (upward in FIG. 5, outwardly or normal to the page in FIGS. 6A and 6B).

The intensity of each color of light emitted depends on the electrical bias applied to the associated top contacts, the light intensity varying proportionately to the current magnitude, once the current exceeds the lasing threshold value.

The color of light produced by the device is controlled as follows. Three matched pairs of top contacts 72-73, 76-75, 79-78 are disposed above three pairs of lasing patches 52-53, 49-50, 47-48j, as described above. Each pair of lasing patches contains quantum dots having a different color emitting capability, due to the different sizes (diameter and depth) of the quantum dots that are within each pair of lasing patches. Each pair of lasing patches 47-48, 49-50, 52-53, is surrounded by a corresponding segment 80-81, 82-83, and 84-85 of segmented grating 46, such that the period, or radial spacing, of the grating's incremental segments that are adjacent to each lasing patch pair is matched to the color of light that is produced by that lasing patch pair. Concentric grating 46 consists of six, pie-shaped sections as shown in FIG. 6A: the two sections 80 and 81 for blue light, the two sections 82 and 83 for green light, and the two sections 84 and 85 for red light. For each color having a wavelength $\lambda$, the size and spacing of each grating section is determined by $\lambda/2n$, where n is the average index of refraction of lasing layer 59.

In other words, lasing patches 47 and 48 produce blue light. Adjacent grating sections 80 and 81 are sized to provide resonance to the blue light, and to diffract it out normally to the surface so the light emits from one pixel. Each pixel includes all three pairs of lasing patches 47-48, 49-50, and 52-53, and corresponding grating sections 80-81, 82-83, and 84-85. Hence, each pixel can emit any combination of the three colors. Although the three wavelengths produced are fixed by the choice of quantum dot size and the size of the diffraction gratings, the response of the human eye causes the viewer to perceive a blended color, rather than the three individual colors that are emitted. The color perceived depends on the amount, or intensity, of each wavelength emitted.

While the exemplary preferred embodiments of the present invention are described herein with particularity, those having normal skill in the art will recognize various changes, modifications, additions and applications other than those specifically mentioned herein without departing from the spirit of this invention. For example, n-type SiC layer 45 could be replaced by an n-type ZnS layer. Similarly, p-type Si—C layer 54 could be replaced by a p-type ZnS layer.

In the embodiments of the invention as above described, lasing layer 54 was described as being comprised of n-type silicon carbide, layer 59 that contains the three different size quantum dots and the corresponding isolation matrix was described as being comprised of hydrogenated amorphous silicon, and layer 54 was described as being comprised of p-type silicon carbide.

Within the spirit and scope of this invention, layer 45 may be p-type silicon carbide, and layer 54 may be n-type silicon carbide. In either event, the polarity of the voltage that is applied to contact 90, and the opposite polarity of the voltage that is applied to top contacts 72,73,75,76,78,79, is such that a positive polarity is applied to the p-type material, and a negative polarity is applied to the n-type material.

Also within the spirit and scope of this invention, layer 45 may comprise a semiconductor layer of one conductivity type that is selected from the semiconductor group GaP, SiC, GaN, ZnS, and layer 54 may comprise a semiconductor layer of the opposite conductivity type that is selected from the semiconductor group GaP, SiC, GaN, ZnS.

What is claimed is:

1. Apparatus for emitting varying colors of light comprising:

a lasing layer formed of crystalline silicon quantum dots formed in an isolation matrix of hydrogenated silicon;

said quantum dots being formed in three patches;

each of said three patches having different sized quantum dots therein to thereby produce three different colors of light;

a barrier layer of p-type semiconductor under said lasing layer, said p-type semiconductor being selected from the group GaP, SiC, GaN, ZnS;

a substrate member under said barrier layer;

an n-type semiconductor layer above said lasing layer, said n-type semiconductor layer being selected from the group GaP, SiC, GaN, ZnS;

a positive potential contact beneath said substrate member;

three negative potential contacts;

each of said three contacts being above a different one of said three patches;

each of said three contacts acting with said positive contact to selectively bias a different one of said three patches;

three sectors of concentric grating surrounding said three patches;

each of said sectors having a radial period corresponding to the color of light produced by an adjacent one of said three patches; and each of said sectors resonating photons emitted by said adjacent patch to stimulate coherent light emission.

2. The apparatus of claim 1 including:

a dielectric mirror between said barrier layer and said substrate member.

3. Apparatus for emitting varying colors of light comprising:

a lasing layer formed of crystalline silicon quantum dots formed in an isolation matrix of hydrogenated silicon;

said quantum dots being formed in three patches;

each of said three patches having different sized quantum dots therein to thereby produce three different colors of light;

a semiconductor barrier layer of one-conductivity-type under said lasing layer, said one-conductivity-type semiconductor being selected from the group GaP, SiC, GaN, ZnS;

a substrate member under said barrier layer;

a semiconductor layer of a conductivity type that is opposite to said one-conductivity-type above said lasing layer, said opposite conductivity type semiconductor layer being selected from the group GaP, SiC, GaN, ZnS;

a first electrical contact beneath said substrate member;

second, third and fourth electrical contacts;

each of said second, third and fourth electrical contacts being above a different one of said three patches;

each of said second, third and fourth electrical contacts acting with said first electrical contact to selectively bias a different one of said three patches;

three sectors of concentric grating surrounding said three patches;

each of said sectors having a radial period corresponding to the color of light produced by an adjacent one of said three patches; and each of said sectors resonating photons emitted by said adjacent patch to stimulate coherent light emission.

4. The apparatus of claim 3 including:

a dielectric mirror between said barrier layer and said substrate member.

* * * * *